United States Patent
Asao

(10) Patent No.: US 7,092,282 B2
(45) Date of Patent: Aug. 15, 2006

(54) SEMICONDUCTOR INTEGRATED CIRCUIT DEVICE

(75) Inventor: Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 10/638,353

(22) Filed: Aug. 12, 2003

(65) Prior Publication Data

US 2004/0141366 A1 Jul. 22, 2004

(30) Foreign Application Priority Data

Aug. 12, 2002 (JP) ............................. 2002-235071

(51) Int. Cl.
*G11C 11/00* (2006.01)
(52) U.S. Cl. ...................... 365/158; 365/171; 365/173
(58) Field of Classification Search ................ 365/158, 365/171, 173
See application file for complete search history.

(56) References Cited

U.S. PATENT DOCUMENTS 5,946,228 A   8/1999  Abraham et al.
6,661,689 B1* 12/2003 Asao et al. ..................... 365/63
6,879,514 B1*  4/2005 Hosomi et al. ............. 365/158
2003/0137028 A1* 7/2003 Hosotani et al. ............ 257/528

OTHER PUBLICATIONS

Roy Scheuerlein, et al., "A 10ns Read and Write Non-Volatile Memory Array Using a Magnetic Tunnel Junction and FET Switch in Each Cell", ISSCC 2000, Session 7, Technical Digest, Paper TA 7.2, 2000 IEEE, Feb. 8, 2000, pp. 128-129.

* cited by examiner

*Primary Examiner*—Richard Elms
*Assistant Examiner*—Hien Nguyen
(74) *Attorney, Agent, or Firm*—Oblon, Spivak, McClelland, Maier & Neustadt, P.C.

(57) ABSTRACT

A semiconductor integrated circuit device comprises magneto-resistive elements, bit lines electrically connected to the magneto-resistive elements at an end of the latter, read word lines electrically connected to the magneto-resistive elements at the other end of the latter and write word lines. The write word lines are insulated from the magneto-resistive elements and adapted to apply a magnetic field to selected magneto-resistive elements at the time of writing data to the selected magneto-resistive elements.

16 Claims, 16 Drawing Sheets

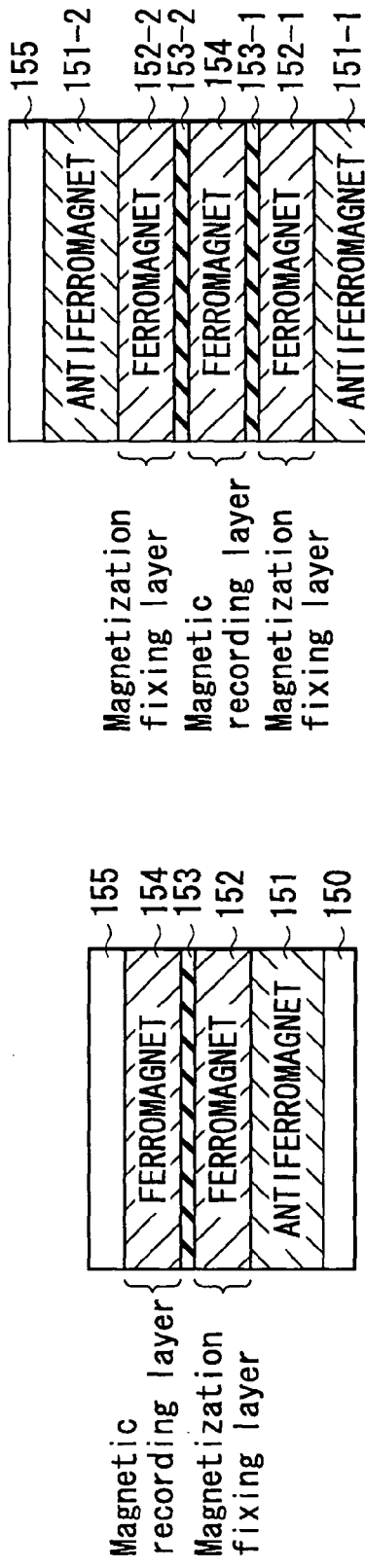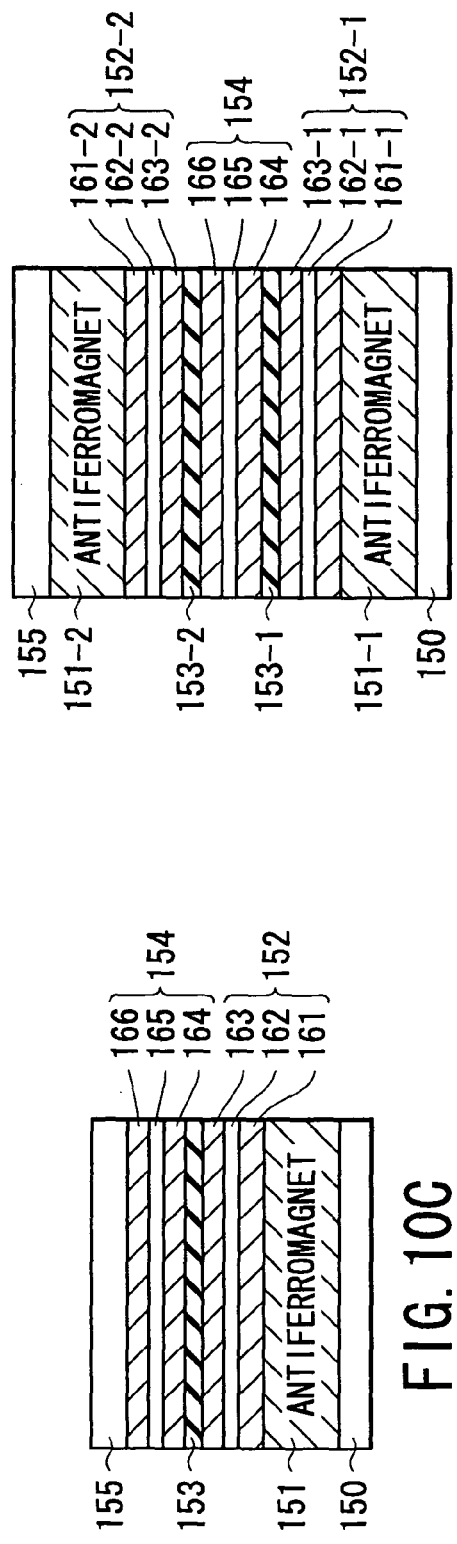
FIG. 10A, FIG. 10B, FIG. 10C, FIG. 10D

Transfer first MRAM data to write control section

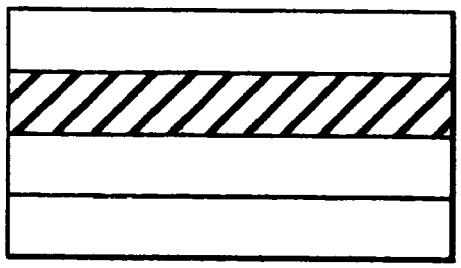
TMR (Tunnel magneto-resistance) element
FIG. 18
Prior Art
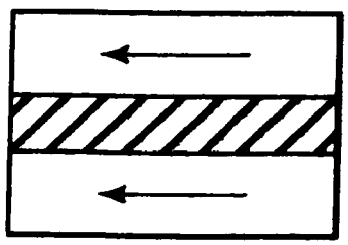
Parallel
(small resistance)
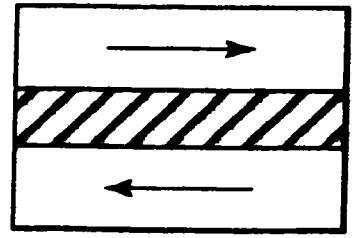
Opposite parallel
(large resistance)
TMR Effect
FIG. 19A
Prior Art
FIG. 19B
Prior Art Cell realized by applying MOSFET as switching element Cross point cell having no switching element Cell realized by applying diode as switching element

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2002-235071, filed Aug. 12, 2002, the entire contents of which are incorporated herein by reference.

BACKGROUND OF THE INVENTION

1. Field of the Invention

This invention relates to a semiconductor integrated circuit device. More particularly, it relates to a semiconductor integrated circuit device comprising memory cells including magneto-resistive effect elements.

2. Description of the Related Art

A variety of memories adapted to store information on the basis of novel theorems have been proposed in recent years. As such memories, magnetic random memories that utilize the magneto-resistive effect, the tunneling magneto-resistive (to be referred to as TMR hereinafter) effect proposed by Roy Scheuerlein et al. in particular, are known.

(Reference Paper)

ISSCC2000 Technical Digest p. 128 "A 10 ns Read and Write Non-Volatile Memory Array Using a Magnetic Tunnel Junction and FET Switch in each Cell"

A magnetic random access memory stores information in the form of "1s" and "0s" by means of TMR elements. As shown in FIG. 18 of the accompanying drawing, the TMR element has a structure of sandwiching an insulating layer (tunnel barrier layer) between a pair of magnetic layers (ferromagnetic layers). The information stored in a TMR element is judged on the basis if the spinning directions of the paired magnetic layers are in parallel or in opposite parallel.

Referring to FIGS. 19A and 19B, "parallel" refers to a situation where the spinning directions of the paired magnetic layers are identical, whereas "opposite parallel" refers to a situation where the spinning directions of the paired magnetic layers are opposite relative to each other (arrows indicate spinning directions).

Normally, an antiferromagnetic layer is arranged at the side of one of the paired magnetic layers. The antiferromagnetic layer is a member that is adapted to facilitate the operation of writing information by fixing the spinning direction of the one magnetic layer and reversing the spinning direction of the other magnetic layer.

The tunnel resistance of the insulating layer (tunnel barrier layer) sandwiched between the paired magnetic layers is minimized when the spinning directions of the two magnetic layers are in parallel as shown in FIG. 19A. This state may be "1" state.

On the other hand, the tunnel resistance of the insulating layer (tunnel barrier layer) is maximized when the spinning directions of the two magnetic layers are in opposite parallel as shown in FIG. 19B. This state may be "0" state.

Now, the principle underlying the operation of writing information on the TMR element will be briefly described with reference to FIG. 20.

The TMR element is arranged on the crossing of a write word line WWL and a data selection line (bit line) BL that intersect each other. The writing operation is performed by causing electric currents to flow respectively through the write word line WWL and the data selection line BL and making the spinning directions of the TMR element in parallel or in opposite parallel relative to each other by means of the magnetic field produced by the electric currents flowing through the wires.

When writing data, an electric current is made to flow through the data selection line BL only in a given direction, whereas the electric current that flows through the write word line WWL is made to run in a direction or in the opposite direction depending on the data to be written. The spinning directions of the TMR element are in parallel (in the "1" state) when an electric current is made to flow through the write word line WWL in the first direction, whereas the spinning directions of the TMR element are in opposite parallel (in the "0" state) when an electric current is made to flow through the write word line WWL in the second direction.

The spinning directions of the TMR element are changed in a manner as described below.

Referring to FIG. 21A showing a TMR curve, the resistance of the TMR element changes typically by 17% when a magnetic field Hx is applied to it along a long side (easy-axis) of the TMR element. The rate of the change, or the ratio of the resistances observed before and after the change is referred to as MR ratio.

The MR ratio can vary depending on the nature of the magnetic layers. Currently, TMR elements showing an MR ratio of about 50% are available.

The combined magnetic field of the magnetic field Hx in the direction of the easy-axis and the magnetic field Hy in the direction of the hard-axis is applied to the TMR element. As shown by the solid lines and the dotted lines in FIG. 21A, the magnitude of the magnetic field Hx in the direction of the easy-axis that is necessary for changing the resistance of the TMR element can change depending on the magnitude of the magnetic field Hy in the direction of the hard-axis. It is possible to write data only on the TMR element arranged on the crossing of the selected write word line WWL and the selected data selection line BL out of the memory cells arranged in the form of an array by utilizing this phenomenon.

This will be described further with reference to the asteroidal curve illustrated in FIG. 21B.

FIG. 21B shows a typical asteroidal curve of a TMR element by means of solid lines. If the magnitude of the combined magnetic field of the magnetic field Hx in the direction of the easy-axis and the magnetic field Hy in the direction of the hard-axis is found outside the asteroidal curve (solid lines) (as indicated by black dots), it is possible to reverse the spinning direction of the related magnetic layer.

Conversely, if the magnitude of the combined magnetic field of the magnetic field Hx in the direction of the easy-axis and the magnetic field Hy in the direction of the hard-axis is found inside the asteroidal curve (solid lines) (as indicated by white dots), it is not possible to reverse the spinning direction of the related magnetic layer.

Therefore, it is possible to control the operation of writing data on the TMR element by changing the magnitude of the combined magnetic field of the magnetic field Hx in the direction of the easy-axis and the magnetic field Hy in the direction of the hard-axis as indicated by a position in the Hx-Hy plane.

The data written on a selected TMR element can be read out by flowing an electric current to the TMR element and detecting the resistance of the TMR element.

For example, switching elements are connected to the respective TMR elements in series and only the switching elements connected to the selected read word line are turned on to form an electric current path. As a result, an electric flows only to the selected TMR elements so that it is possible to read the data stored in the TMR elements. Of the accompanying drawing, FIG. 22 is a cross sectional view of a typical magnetic random access memory obtained by applying MOSFETs as switching elements, FIG. 23 is a cross sectional view of another typical magnetic random access memory obtained by applying diodes as switching elements.

However, in the case of memory cells illustrated in FIGS. 22 and 23, each of them occupies a large area because it has a switching element in it.

Cells having no switching element have been proposed by Infineon Technologies AG, in order to reduce the area occupied by each cell. A memory cell array formed on the proposed concept by applying practical design rules may show a cross sectional view as illustrated in FIG. 24.

In the structure illustrated in FIG. 24, a data selection line BL and a read/write word line RWWL are directly connected to each TMR element and a high voltage is applied to a selected TMR element for a write operation. Then, the voltage resisting performance of each TMR will be degraded at an enhanced pace.

BRIEF SUMMARY OF THE INVENTION

A semiconductor integrated circuit device according to a first aspect of the present invention comprises: magneto-resistive elements; bit lines electrically connected to the magneto-resistive elements at an end of the latter; read word lines electrically connected to the magneto-resistive elements at the other end of the latter; and write word lines insulated from the magneto-resistive elements and adapted to apply a magnetic field to selected magneto-resistive elements at the time of writing data to the selected magneto-resistive elements.

A semiconductor integrated circuit device according to a second aspect of the present invention comprises: first magneto-resistive elements; second magneto-resistive elements; first bit lines electrically connected to the first magneto-resistive elements at an end of the latter; second bit lines electrically connected to the second magneto-resistive elements at an end of the latter; first word lines electrically connected to the first magneto-resistive elements at the other ends of the latter and insulated from the second magneto-resistive elements; and second word lines electrically connected to the second magneto-resistive elements at the other ends of the latter and insulated from the first magneto-resistive elements; wherein the first word lines are arranged in parallel with the second word lines, the first magneto-resistive elements are arranged above the second word lines and the second magneto-resistive elements are arranged above the first word lines.

A semiconductor integrated circuit device according to a third aspect of the present invention comprises: a plurality of bit lines; a plurality of word lines rectangularly intersecting the plurality of bit lines; and a plurality of memory cells including magneto-resistive elements arranged at the respective crossings of the plurality of word lines and the plurality of bit lines; wherein the magneto-resistive elements are arranged in the same direction of the plurality of bit lines in rows at a pitch P and the magneto-resistive elements of each row are displaced by P/n (n being an integer).

BRIEF DESCRIPTION OF THE SEVERAL VIEWS OF THE DRAWING

FIG. 10A is a schematic cross sectional view showing a magneto-resistive effect element according to a first example;

FIG. 10B is a schematic cross sectional view showing a magneto-resistive effect element according to a second example;

FIG. 10C is a schematic cross sectional view showing a magneto-resistive effect element according to a third example;

FIG. 10D is a schematic cross sectional view showing a magneto-resistive effect element according to a fourth example;

FIG. 18 is a schematic cross sectional view showing a TMR element;

FIGS. 19A and 19B are diagrams showing a TMR effect;

DETAILED DESCRIPTION OF THE INVENTION

Figure 1A:
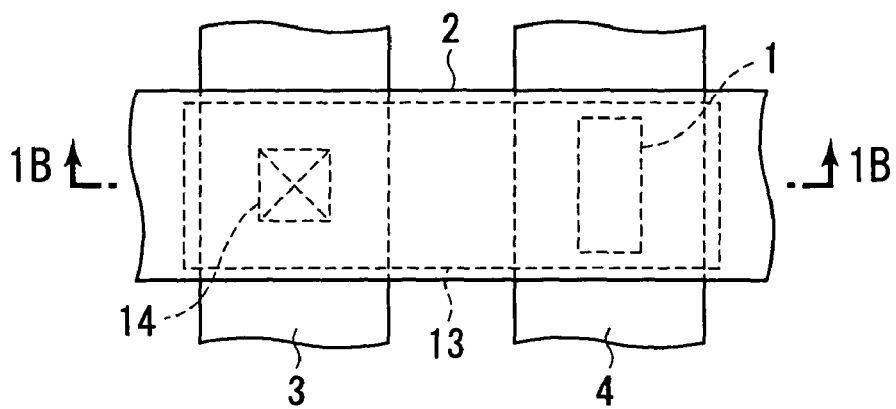
FIG. 1A is a schematic plan view showing a magnetic a random access memory according to a first embodiment of this invention.

The present invention will be described with reference to the accompanying drawing. The components identical or similar to one another are denoted at the same reference symbols in the drawings.

1st EMBODIMENT

Figure 1B:
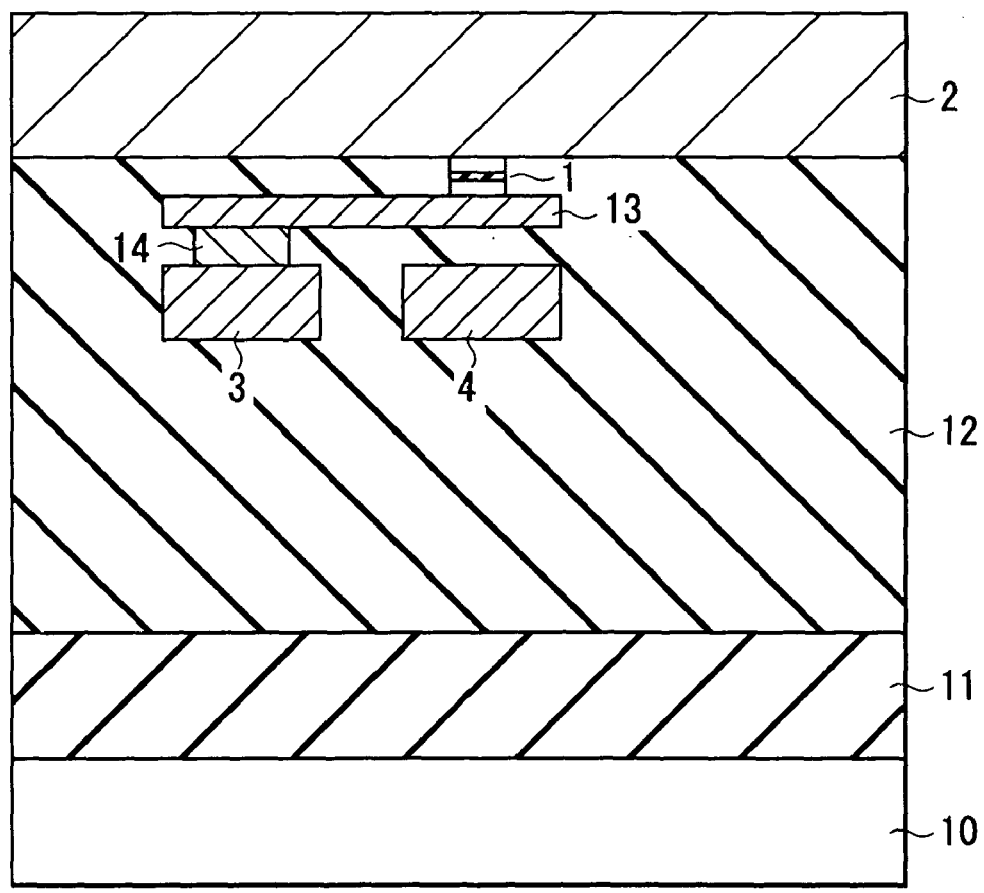
FIG. 1B is a cross sectional view taken along line 1B—1B in FIG. 1A.

FIG. 1A is a schematic plan view showing a magnetic a random access memory according to a first embodiment of this invention. FIG. 1B is a cross sectional view taken along line 1B—1B in FIG. 1A.

As shown in FIG. 1, the first embodiment comprises magneto-resistive elements 1, bit lines 2 electrically connected to the magneto-resistive elements 1 at an end of the latter, read word lines 3 electrically connected to the magneto-resistive elements 1 at the other end of the latter and write word lines 4 insulated from the magneto-resistive elements 1 and adapted to apply a magnetic field to selected magneto-resistive elements 1 at the time of writing data to the selected magneto-resistive elements 1.

Now, the structure of the cross section of the first embodiment will be described.

An element isolating region 11 is formed on a semiconductor substrate, for example a silicon substrate 10. An interlayer insulating film 12 is formed on the element isolating region 11. A read word line 3 and a write word line 4 are arranged in parallel with each other in the interlayer insulating film 12. Thus, they may be arranged at the same level. A drawing out electrode 13 is arranged above the read word line 3 and the write word line 4. The drawing out electrode 13 is a line that electrically connected the read word line 3 to the other end of the magneto-resistive element 1. In this embodiment, the drawing out electrode 13 is connected to the read word line 3 by way of a via 14. The magneto-resistive element 1 is formed on the drawing out electrode 13. The write word line 4 is formed below the magneto-resistive element 1. The magneto-resistive element 1 may be a TMR element.

Now, a possible layout of the first embodiment will be described below.

Figure 2:
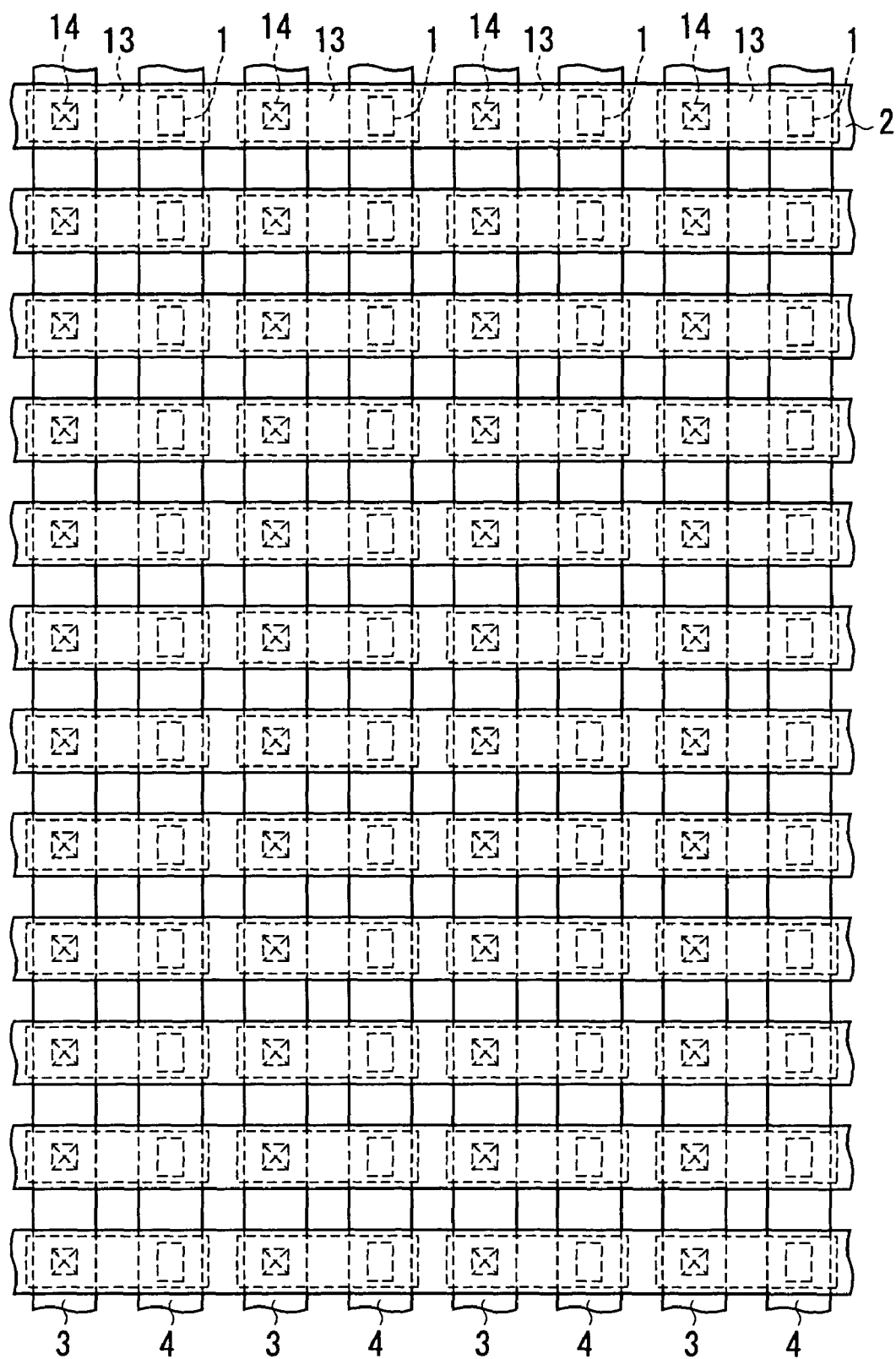
FIG. 2 is a schematic plan view showing a layout example of a memory cell array of the magnetic random access memory according to the first embodiment.

FIG. 2 is a schematic plan view showing a layout example of a memory cell array of the magnetic random access memory according to the first embodiment.

With the layout illustrated in FIG. 2, read word lines 3 and write word lines 4 are arranged alternately. Magneto-resistive elements 1 are arranged in a row above each write word line 4. Vias 14 are arranged in a row above each read word line 3.

Typical advantages of the first embodiment will be discussed below.

Figure 3:
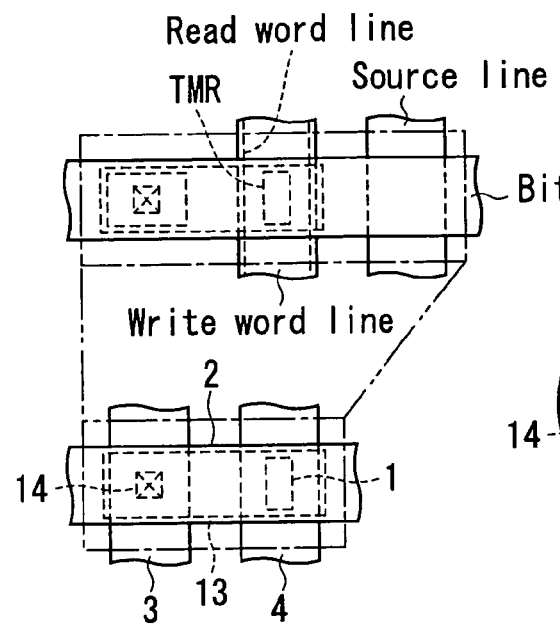
FIG. 3 is a diagram showing advantages of the magnetic random access memory according to the first embodiment.

FIG. 3 is a diagram showing advantages of the magnetic random access memory according to the first embodiment.

As shown in FIG. 3, the cell area of each memory cell of the first embodiment can be reduced if compared with that of a memory cell having a MOSFET as switching element because the memory cell of this embodiment does not have any switching element.

Additionally, the first embodiment is provided with read word lines 3 that are used when reading data and write word lines 4 that are used when writing data so that they take respective roles. As a result, if compared with a cross point type conventional memory cell, the magneto-resistive element 1 of a selected memory cell is hardly subjected to a high voltage when writing data. Thus, it is possible to suppress degradation of the voltage resisting performance of the TMR element.

Therefore, with the first embodiment, it is possible to provide a semiconductor integrated circuit device comprising memory cells including magneto-resistive elements that can reduce the cell area of each memory cell if compared with that of a memory cell having magneto-resistive elements and a switch element and suppress degradation of the voltage resisting performance of the magneto-resistive element.

2nd EMBODIMENT

Figure 4:
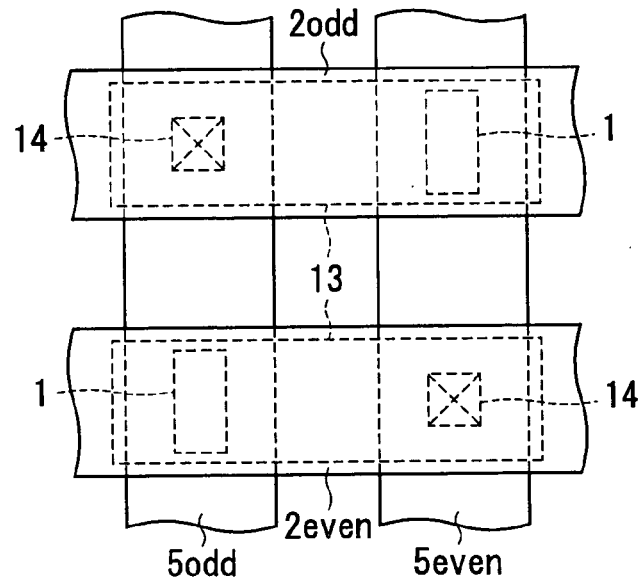
FIG. 4 is a schematic plan view showing a magnetic random access memory according to the second embodiment of this invention.

FIG. 4 is a schematic plan view showing a magnetic random access memory according to the second embodiment of this invention.

As seen from FIG. 4, the second embodiment differs from the first embodiment in that vias 14 and magneto-resistive elements 1 are arranged alternately on bit lines 2 (2odd, 2even). As a result, the word lines are replaced by read/write word lines 5 (5odd, 5even) that are used for both reading and writing operations.

Each read/write word line 5odd operates as read word line when a bit line 2odd is selected for a reading operation and as write word line when a bit line 2even is selected for a writing operation.

On the other hand, each read/write word line 5even operates as read word line when a bit line 2even is selected for a reading operation and as write word line when a bit line 2odd is selected for a writing operation.

A structure as described above for the first embodiment with reference to a cross sectional view can also be applied to the second embodiment.

Now, a possible layout of the second embodiment will be described below.

Figure 5:
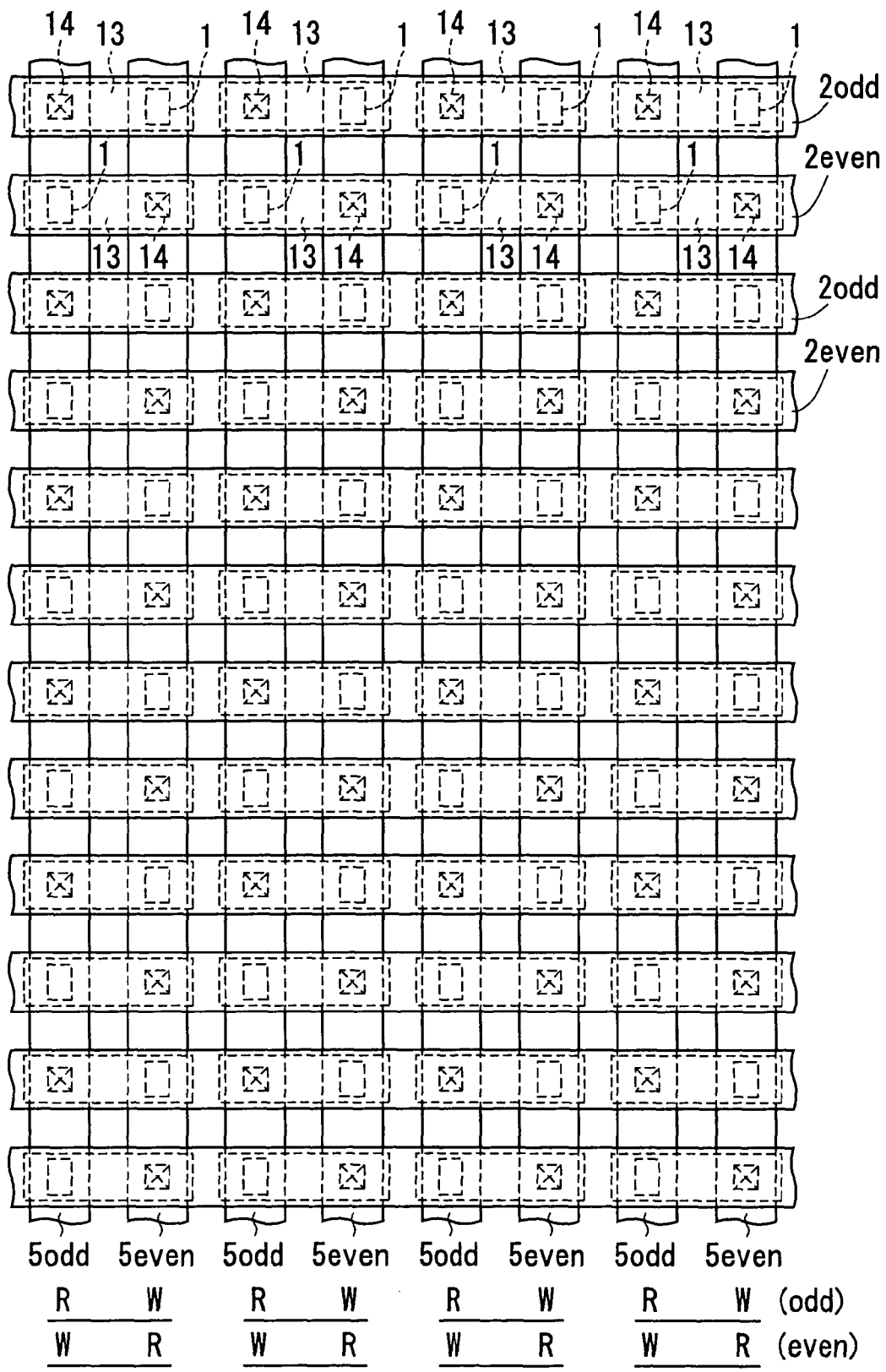
FIG. 5 is a schematic plan view showing a layout example of a memory cell array of the magnetic random access memory according to the second embodiment.

FIG. 5 is a schematic plan view showing a layout example of a memory cell array of the magnetic random access memory according to the second embodiment.

With the layout illustrated in FIG. 5, read/write word lines 5odd and read/write word lines 5even are arranged alternately. The bit lines 2odd, 2even are so arranged as to typically rectangularly intersect the read/write word lines 5odd, 5even. The magneto-resistive elements 1 are arranged checkerwise on the read/write word lines 5odd, 5even. Similarly, the vias 14 are arranged checkerwise on the read/write word lines 5odd, 5even.

Combinations of read R/write W are also shown in FIG. 5.

Now, typical advantages of the second embodiment will be discussed below.

Figure 6:
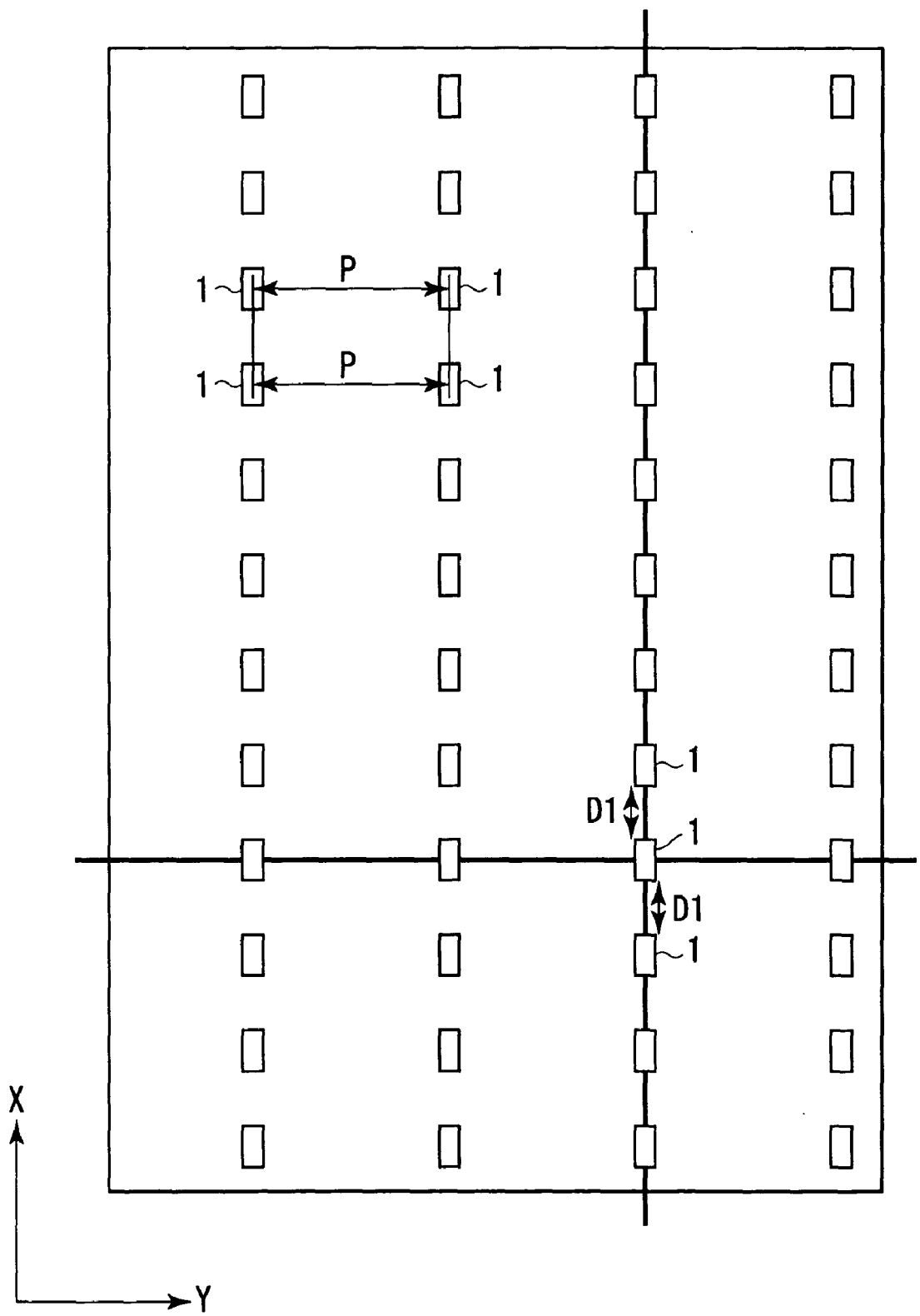
FIG. 6 is a diagram showing a possible crosstalk that can appear in the magnetic random access memory according to the first embodiment.
Figure 7:
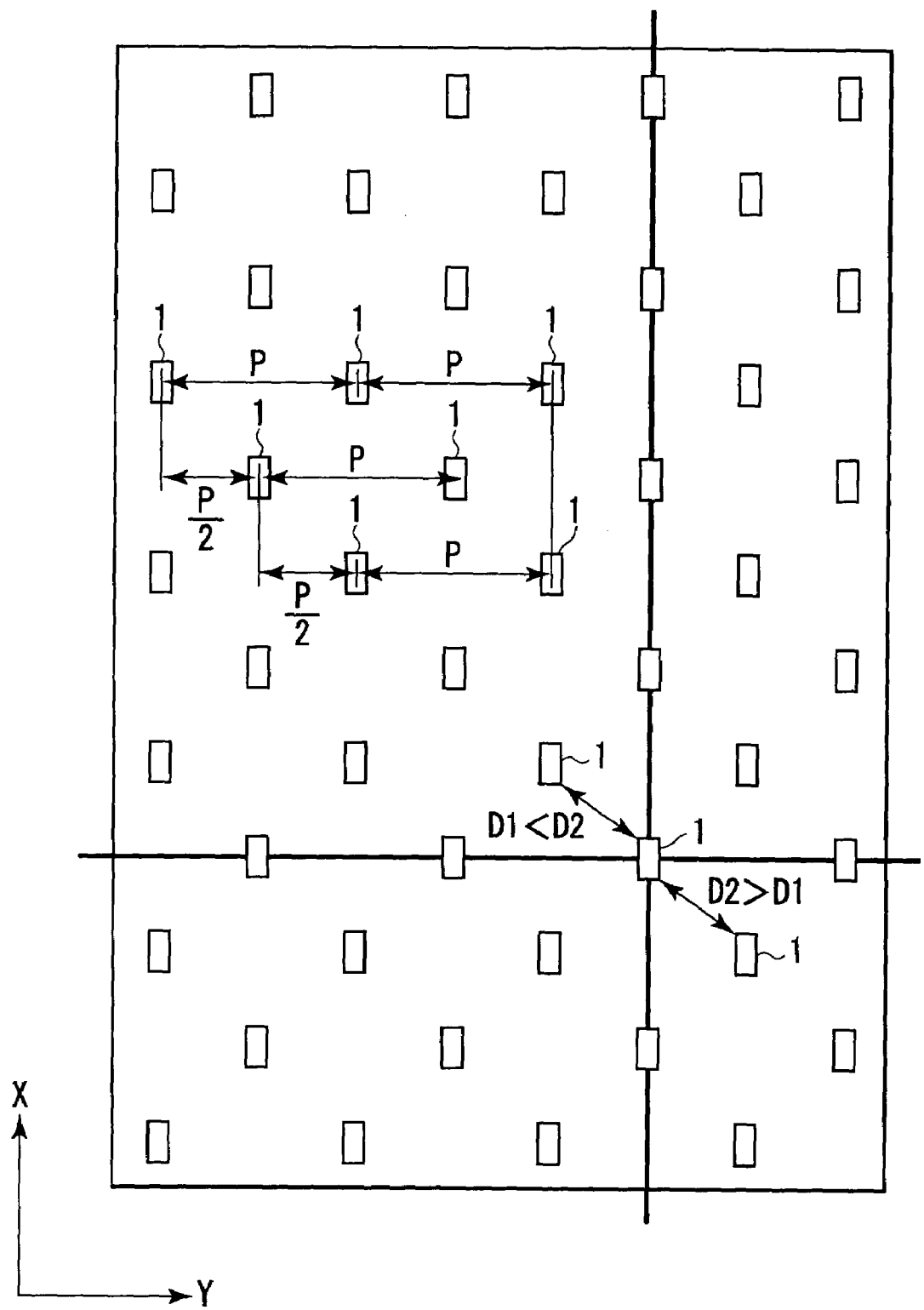
FIG. 7 is a diagram showing a possible crosstalk that can appear in the magnetic random access memory according to the second embodiment.

FIG. 6 is a diagram showing a possible crosstalk that can appear in the magnetic random access memory according to the first embodiment. FIG. 7 is a diagram showing a possible crosstalk that can appear in the magnetic random access memory according to the second embodiment.

As shown in FIG. 6, the magneto-resistive elements 1 of each row running along Y-direction are arranged at a given pitch P and exactly side by side relative to the adjacently located bit lines. Thus, the distance separating two adjacently located magneto-resistive elements 1 in X-direction is D1.

As shown in FIG. 7, on the other hand, in the second embodiment, the magneto-resistive elements 1 of each row running along Y-direction are also arranged at a given pitch P but displaced by P/n (n being an integer). In the illustrated example, n is equal to 2 and hence the magneto-resistive elements 1 of each row are displaced by P/2. In other words, the distance separating two adjacently located magneto-resistive elements 1 in X-direction is D2, which is greater than D1.

A typical advantage of this arrangement is that the distance D2 is relatively large so that each magneto-resistive element is hardly affected by a crosstalk during a data writing operation.

Therefore, the second embodiment provides an advantage that each magneto-resistive element is hardly affected by a crosstalk during a data writing operation in addition to the advantages of the first embodiment.

While n of P/n (n being an integer) is 2 in the above description, it may be needless to say that n may be other than 2.

3rd EMBODIMENT

Figure 8:
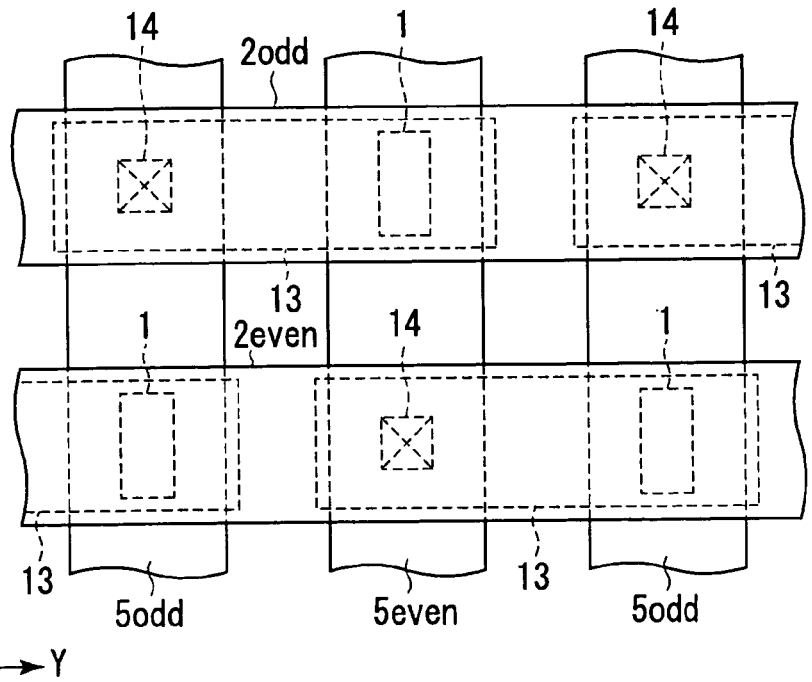
FIG. 8 is a schematic plan view showing a magnetic random access memory according to the third embodiment of this invention.

FIG. 8 is a schematic plan view showing a magnetic random access memory according to the third embodiment of this invention.

As seen from FIG. 8, the third embodiment differs from the second embodiment in that each drawing out electrode 13 is displaced from the adjacently located ones along Y-direction.

A structure as described above for the second embodiment with reference to a cross sectional view can also be applied to the third embodiment.

Now, a possible layout of the third embodiment will be described below.

Figure 9:
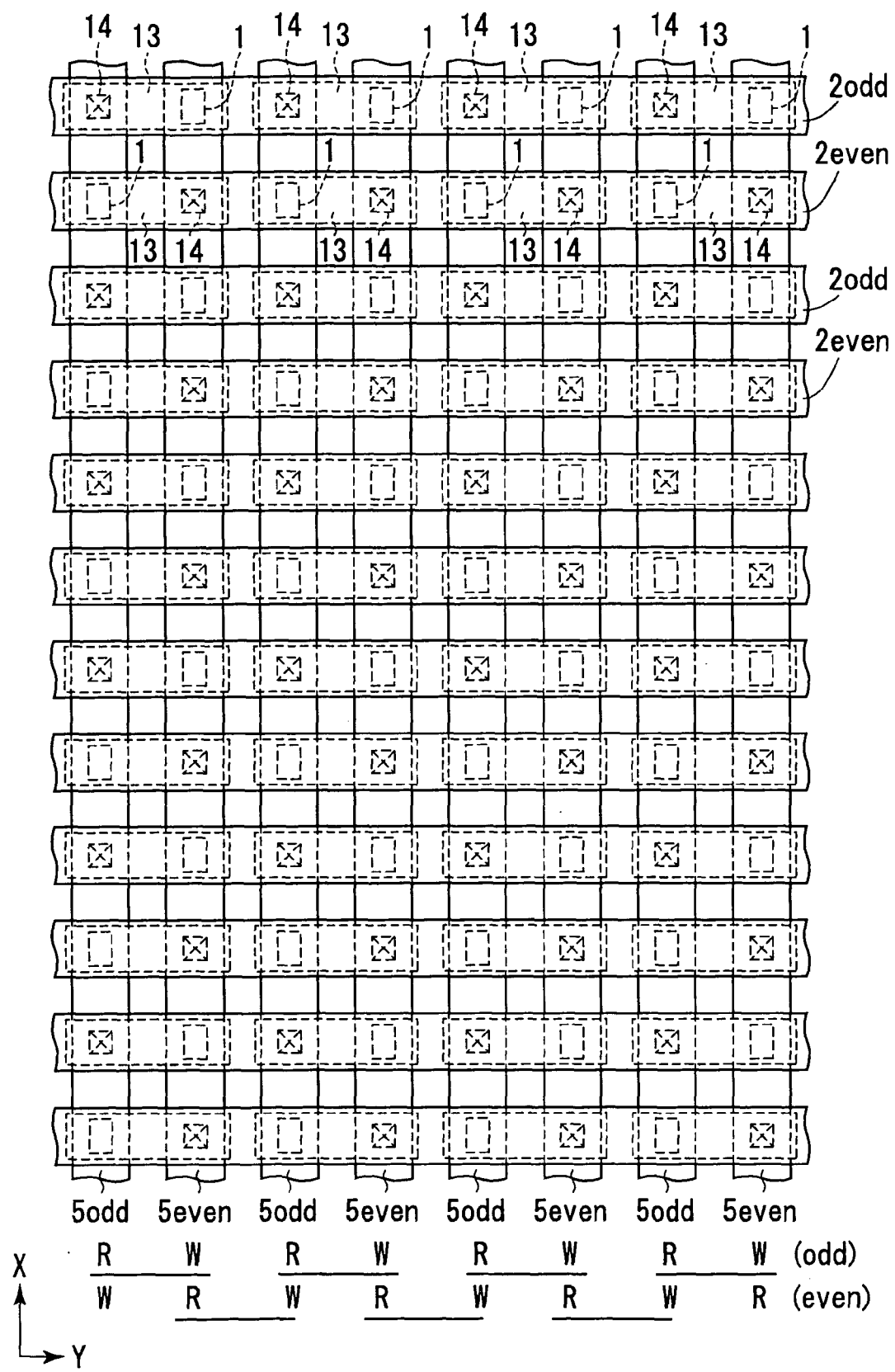
FIG. 9 is a schematic plan view showing a layout example of a memory cell array of the magnetic random access memory according to the third embodiment.

FIG. 9 is a schematic plan view showing a layout example of a memory cell array of the magnetic random access memory according to the third embodiment.

As seen from FIG. 9, the illustrated layout of the third embodiment differs from that of the second embodiment in that each of the drawing out electrodes 13 is displaced. Otherwise, they are substantially identical.

Combinations of read R/write W are also shown in FIG. 9. It will be appreciated by comparing the second embodiment and the third embodiment that one of the combinations of this embodiment is shifted by one when a bit line 2even is selected. This shift can be accommodated by determining if the lowest order bit of the address, the column address for example, is "0" or "1". More specifically, the shift can be accommodated by changing addressing in such a way that one of the combinations is shifted by one when the lowest order bit is "1".

Now, a typical advantage of the third embodiment will be described below.

As pointed out above, the third embodiment differs from the second embodiment in that each drawing out electrode 13 is displaced. Therefore, it is possible to provide regions where two drawing out electrodes 13 that are adjacently located along X-direction can be separated from each other by a large distance. If an electrically conductive foreign object enters in a large distance region during the manufacturing process, the adjacently located drawing out electrodes 13 can hardly be short-circuited.

Therefore, the third embodiment provides an advantage that drawing out electrodes 13 that are adjacently located along X-direction can hardly be short-circuited in addition to the advantages of the second embodiment so that it is possible to improve the manufacturing yield.

EXAMPLES OF MAGNETO-RESISTIVE EFFECT ELEMENTS

1st Example

TMR elements can be used for the magneto-resistive effect elements 1 described above for the first through third embodiments. Now, several examples of TMR element will be described below.

FIG. 10A is a schematic cross sectional view showing a magneto-resistive effect element according to a first example.

As shown in FIG. 10A, an antiferromagnetic layer 151, a ferromagnetic layer 152, a tunnel barrier layer 153, a ferromagnetic layer 154 and a protection layer 155 are sequentially formed on an underlayer 150.

In this example, the ferromagnetic layer 152 operates as magnetization fixing layer in which the spinning direction is fixed, whereas the ferromagnetic layer 154 operates as magnetic recording layer in which the spinning direction is changed. The antiferromagnetic layer 151 is a layer to be used for fixing the spinning direction of the ferromagnetic layer 152. The spinning direction of the ferromagnetic layer 152 that operates as magnetization fixing layer may be fixed by using, for instance, the antiferromagnetic layer 151.

The underlayer 150 is typically used to facilitate the operation of forming the ferromagnetic layers and the antiferromagnetic layer and protect them. It is provided whenever necessary. The protection layer 155 is typically used to protect the ferromagnetic layers and the antiferromagnetic layer. Like the underlayer 150, it is provided whenever necessary. For instance, the protection layer 155 may be formed by utilizing the hard mask layer that is used when patterning the antiferromagnetic layer 151, the ferromagnetic layer 152, the tunnel barrier layer 153, the ferromagnetic layer 154 and the protection layer 155.

The above description on the underlayer 150 and the protection layer 155 applies also to the second through fourth examples, which will be described hereinafter.

Examples of materials that can be used for the ferromagnetic layers 152, 154 include the following.

Fe, Co, Ni and alloys of any of them, magnetite showing a large spinning polarizability, oxides such as $CrO_2$ and $RXMnO_{3-y}$ (R: rare earth element, X: Ca, Ba or Sr), Heusler alloys such as NiMnSb and PtMnSb Materials that can be used for the ferromagnetic layers 152, 154 including those listed above may contain one or more than one non-magnetic elements so long as they do not make the layers lose ferromagnetism.

Examples of non-magnetic elements include the following.

Ag, Cu, Au, Al, Mg, Si, Bi, Ta, B, C, O, N, Pd, Pt, Zr, Ir, W, Mo, Nb

The thickness of the ferromagnetic layers 152, 154 may be such that the ferromagnetic layers 152, 154 do not become super-paramagnetic. Specifically, the ferromagnetic layers 152, 154 may have a thickness not less than 0.4 nm. While there is no limit to the thickness of the ferromagnetic layers 152, 154, the thickness is preferably not more than 100 nm from the viewpoint of preparing TMR elements.

Examples of materials that can be used for the antiferromagnetic layer 151 include the following.

Fe—Mn, Pt—Mn, Pt—Cr—Mn, Ni—Mn, Ir—Mn, NiO, $Fe_2O_3$

Examples of materials that can be used for the tunnel barrier layer 153 include the following.

$Al_2O_3$, $SiO_2$, MgO, AlN, $Bi_2O_3$, $MgF_2$, $CaF_2$, $SrTiO_2$, $AlLaO_3$

Materials that can be used for the tunnel barrier layer 153 including those listed above may contain at least oxygen, nitrogen or fluorine to such an extent that it does not make the obtained layer lose the insulating effect. On the other hand, they may be devoid of at least oxygen, nitrogen or fluorine so long as the obtained layer does not lose the insulating effect.

While the tunnel barrier layer 153 preferably has a small thickness, there are no limitations to the thickness, although the thickness of the tunnel barrier layer 153 may preferably have a thickness not more than 10 nm from the viewpoint of preparing TMR elements.

2nd Example

FIG. 10B is a schematic cross sectional view showing a magneto-resistive effect element according to a second example.

The TMR element illustrated as a second example is referred to as of the double junction type.

As shown in FIG. 10B, an antiferromagnetic layer 151-1, a ferromagnetic layer 152-1, a tunnel barrier layer 153-1, a ferromagnetic layer 154, a tunnel barrier layer 153-2, a ferromagnetic layer 152-2, an antiferromagnetic layer 151-2 and a protection layer 155 are sequentially formed on an underlayer 150.

In this example, the ferromagnetic layers 152-1, 152-2 operate as magnetization fixing layers, whereas the ferromagnetic layer 154 operates as magnetic recording layer. The antiferromagnetic layer 151-1 is a layer to be used for fixing the spinning direction of the ferromagnetic layer 152-1, while the antiferromagnetic layer 151-2 is a layer to be used for fixing the spinning direction of the ferromagnetic layer 152-2.

If compared with a TMR element (single junction type) shown in FIG. 10A, a double junction type TMR element as shown in FIG. 10B provides an advantage that it can increase the ratio of the resistance for the low resistance operation and the resistance for the high resistance operation, or so-called MR ratio (magneto-resistance ratio).

The materials described above for the first example may also be used for the antiferromagnetic layers 151-1, 151-2, the ferromagnetic layers 152-1, 152-2, 154 and the tunnel barrier layers 153-1, 153-2 of this example.

The description about the thickness of the ferromagnetic layers of the first example also applies to the thickness of the ferromagnetic layers 151-1, 151-2, 154 of this example.

The materials and the thickness described above for the first example may also be used for the tunnel barrier layers 153-1, 153-2 of this example.

3rd Example

FIG. 10C. is a schematic cross sectional view showing a magneto-resistive effect element according to a third example.

As shown in FIG. 10C, the TMR element of the third example is obtained by modifying the TMR element of the first example in such a way that the ferromagnetic layers 152, 154 have a stack structure of a ferromagnetic layer and a non-magnetic layer. An example of such a stack structure may be three-layered film of ferromagnetic layer/non-magnetic layer/ferromagnetic layer like the one used in this example. In this example, the ferromagnetic layer 152 is three-layered film of ferromagnetic layer 161/non-magnetic layer 162/ferromagnetic layer 163, whereas the ferromagnetic layer 154 is three-layered film of ferromagnetic layer 164/non-magnetic layer 165/ferromagnetic layer 166.

Examples of materials listed above for the ferromagnetic layers of the first example may also be used for the ferromagnetic layers 161, 163, 164, 166.

Examples of materials that can be used for the non-magnetic layers 162, 165 include the following.

Ru, Ir

Specific examples of three-layered film of ferromagnetic layer/non-magnetic layer/ferromagnetic layer are listed below.

Co/Ru/Co, Co/Ir/Co

Co—Fe/Ru/Co—Fe, Co—Fe/Ir/Co—Fe

When the ferromagnetic layer 152 that operates as magnetization fixing layer is made to have a stack structure, for example three-layered film of ferro-magnetic layer 161/non-magnetic layer 162/ferromagnetic layer 163, it is desirable that an antiferromagnetic bond is produced between the ferromagnetic layer 161 and the ferromagnetic layer 163 with the non-magnetic layer 162 interposed between them. Additionally, an antiferromagnetic layer 151 is arranged so as to be held in contact with the three-layered film. Such a structure provides an advantage that the spinning direction of the ferromagnetic layer 152 operating as magnetization fixing layer, the ferromagnetic layer 163 in particular, can be fixed more firmly. Due to this advantage, the ferromagnetic layer 152, the ferro-magnetic layer 163 in particular, is hardly influenced by a magnetic field produced by an electric current so that inadvertent reversion of the spinning direction of the ferromagnetic layer 152 operating as magnetization fixing layer can be reliably suppressed.

When the ferromagnetic layer 154 that operates as magnetic recording layer is made to have a stack structure, for example three-layered film of ferro-magnetic layer 164/non-magnetic layer 165/ferromagnetic layer 166, it is desirable that an antiferromagnetic bond is produced between the ferromagnetic layer 164 and the ferromagnetic layer 166 with the non-magnetic layer 165 interposed between them. In this case, the magnetic flux is closed in the above described three-layered film so that it is possible to suppress any possible increase in the switching magnetic field attributable to magnetic poles. As a result, there is provided an advantage that it is possible to suppress any possible increase of power consumption caused by a magnetic field produced by an electric current attributable to a demagnetizing field.

The ferromagnetic layer 154 that operates as magnetic recording layer may alternatively be made to have a stack structure of a soft ferromagnetic layer and a ferromagnetic layer. A soft ferromagnetic layer as used herein refers to a layer whose spinning direction can be more easily reversed than the spinning direction of a ferromagnetic layer.

When the ferromagnetic layer 154 is made to have a stack structure of a soft ferromagnetic layer and a ferromagnetic layer, the soft ferromagnetic layer is arranged close to the wire for generating a magnetic field by means of an electric current, a bit line for instance.

The stack structure may be made to additionally include a non-magnetic layer. In the case of three-layered film of ferromagnetic layer 164/non-magnetic layer 165/ferromagnetic layer 166 as described above for this example, the ferromagnetic layer 166 may be replaced by a soft ferromagnetic layer.

While both the ferromagnetic layers 152 and 154 are made to have a stack structure in this example, only the ferromagnetic layer 152 or the ferromagnetic layer 154 may alternatively be made to have a stack structure.

4th Example

FIG. 10D is a schematic cross sectional view showing a magneto-resistive effect element according to a fourth example.

As shown in FIG. 10D, the TMR element of the fourth example is obtained by modifying the TMR element of the second example in such a way that the ferromagnetic layers 152-1, 154, 152-2 have a stack structure as described above with reference to the third example.

In this example, the ferromagnetic layer 152-1 is three-layered film of ferromagnetic layer 161-1/non-magnetic layer 162-1/ferromagnetic layer 163-1 and the ferromagnetic layer 154 is three-layered film of ferromagnetic layer 164/non-magnetic layer 165/ferromagnetic layer 166, whereas the ferromagnetic layer 152-2 is three-layered film of ferromagnetic layer 161-2/non-magnetic layer 162-2/ferromagnetic layer 163-2.

Examples of materials listed above for the ferromagnetic layers of the first example may also be used for the ferromagnetic layers 161-1, 161-2, 163-1, 163-2, 164, 166 of this example.

Examples of materials listed above for the non-magnetic layers of the third examples may also be used for the non-magnetic layers 162-1, 162-2, 165 of this example.

While the ferromagnetic layers 152-1, 154, 152-2 of this example are made to have a stack structure in this example, at least only one of them may alternatively be made to have a stack structure.

The magnetic random access memory (semiconductor memory device) according to the first to third embodiments of this invention can be applied to various devices. Some of the application examples are explained with reference to FIGS. 11 to 17.

Application Example 1

Figure 11:
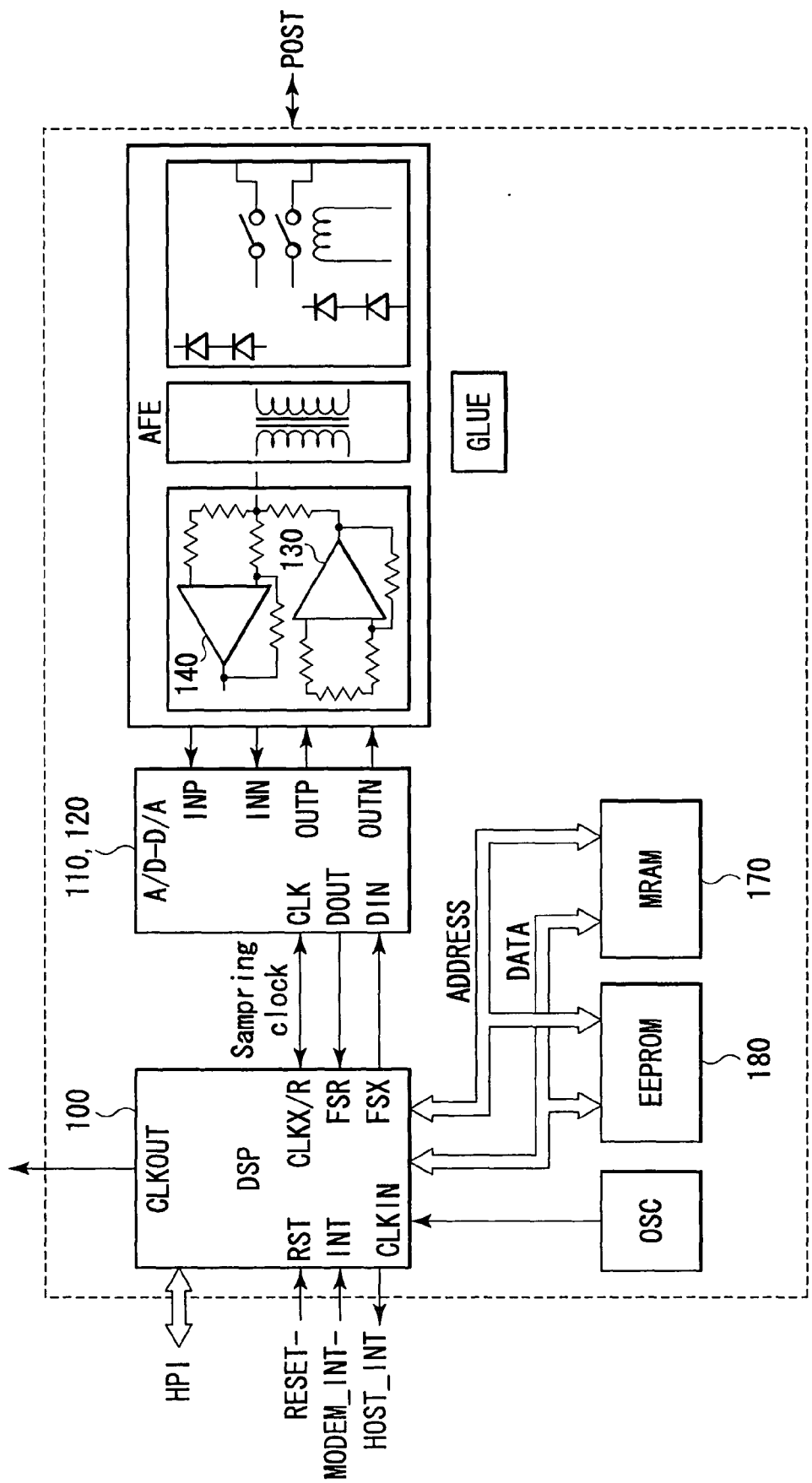
FIG. 11 is a block diagram showing a DSL data path portion of a modem for a digital subscriber line (DSL), for illustrating an application example 1 of the MRAM according to any one of the first to third embodiments of this invention.

FIG. 11 shows an extracted DSL data path portion of a modem for digital subscriber lines (DSL). The modem includes a programmable digital signal processor (DSP) 100, analog/digital (A/D) converter 110, digital/analog (D/A) converter 120, transmission driver 150 and receiver amplifier 160. In FIG. 11, a band pass filter is omitted and a magnetic random access memory 170 and EEPROM 180 of this embodiment are shown as various types of optional memories used to hold a line code program (a program which permits a modem to be selected and operated according to coded subscriber line information and transfer condition (line code; OAM, CAP, RSK, FM, AM, PAM, DWMT and the like) performed by use of the DSP) instead of the band pass filter.

In the present example, two types of memories of the magnetic random access memory 170 and EEPROM 180 are used as a memory to hole the line code program. However, the EEPROM 180 can be replaced by a magnetic random access memory. That is, instead of using two types of memories, only the magnetic random access memory can be used.

Application Example 2

Figure 12:
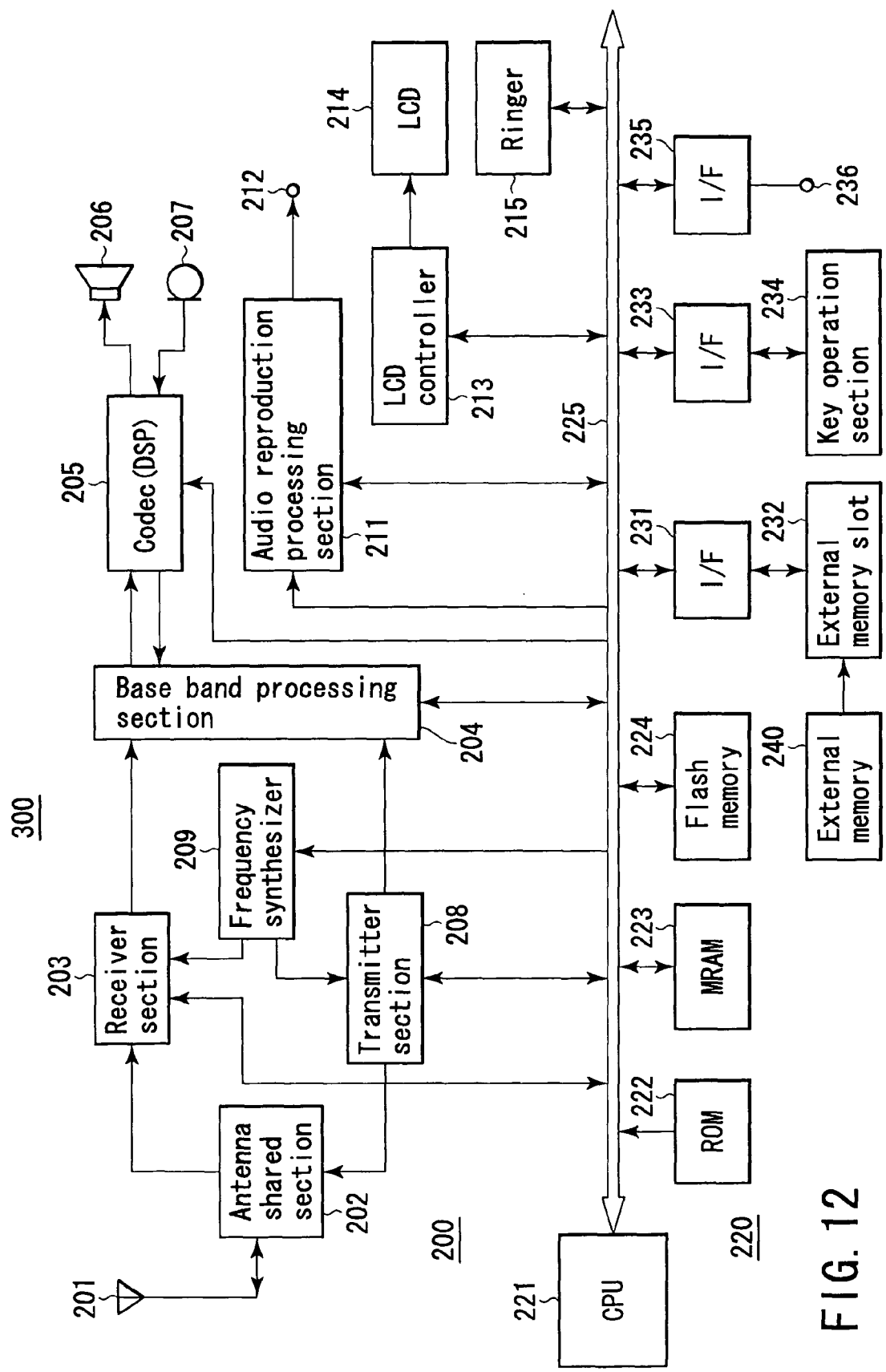
FIG. 12 is a block diagram showing a portable telephone terminal, for illustrating an application example 2 of the MRAM according to any one of the first to eleventh embodiments of this invention.
Figure 13:
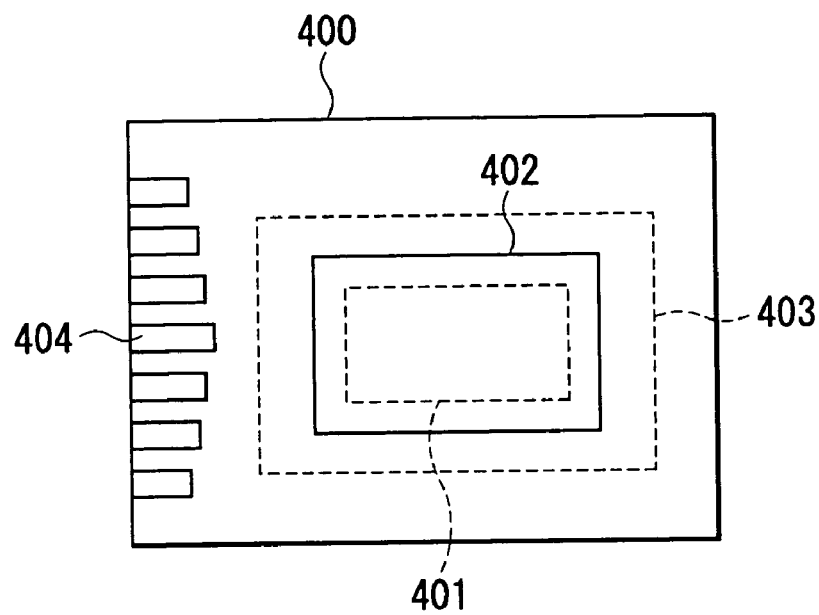
FIG. 13 is a top plan view showing an example in which the MRAM is applied to a card (MRAM card) which receives media contents such as smart media, for illustrating an application example 3 of the MRAM according to any one of the first to eleventh embodiments of this invention.

FIG. 12 shows a portable telephone terminal 300 as another application example. A communication section 200 which realizes the communication function includes a transmission/reception antenna 201, antenna shared section 202, receiver section 203, base band processing section 204, DSP 205 used as a voice codec, speaker (receiver) 206, microphone (transmitter) 207, transmitter section 208 and frequency synthesizer 209.

Further, the portable telephone terminal 300 includes a control section 220 which controls various sections of the portable telephone terminal. The control section 220 is a microcomputer to which a CPU 221, ROM 222, a magnetic random access memory (MRAM) 223 of this embodiment and flash memory 224 are connected via a CPU bus 225. A program executed by the CPU 221 and necessary data for display fonts are previously stored in the ROM 222. The MRAM 223 is mainly used as a working area. It is used to store data obtained in the course of calculations as required while the CPU 221 is executing the program or temporarily store data transferred between the control section 220 and the other sections. Further, when the power supply of the portable telephone terminal 300 is turned OFF, it is desired in some cases to store the set condition obtained immediately before turn-OFF of the power supply and set the same condition when the power supply is next turned ON. For this purpose, the flash memory 224 is used to store set parameters associated with the set condition. Thus, if the power supply of the portable telephone terminal is turned OFF, there is no possibility that the stored set parameters will be lost.

Further, the portable telephone terminal 300 includes an audio reproduction processing section 211, external output terminal 212, LCD controller 213, LCD (liquid crystal display) 214 and a ringer 215 which generates a call sound. The audio reproduction processing section 211 reproduces audio information input to the portable telephone terminal 300 (or audio information stored in an external memory 240 which will be described later). The reproduced audio information is transmitted to a head phone or mobile speaker via the external output terminal 212 and thus can be output to the exterior. Thus, by providing the audio reproduction processing section 211, audio information can be reproduced. For example, the LCD controller 213 receives display information from the CPU 221 via the CPU bus 225, converts the display information into LCD control information used to control the LCD 214 and drives the LCD 214 for display.

In addition, the portable telephone terminal 300 includes interface circuits (I/F) 231, 233, 235, external memory 240, external memory slot 232, key operation section 234 and external input/output terminal 236. A memory card such as the external memory 240 is inserted into the external memory slot 232. The external memory slot 232 is connected to the CPU bus 225 via the interface circuit (I/F) 231. Thus, by providing the slot 232 in the portable telephone terminal 300, it becomes possible to write information in the internal portion of the portable telephone terminal 300 into the external memory 240 and input information (for example, audio information) stored in the external memory 240 to the portable telephone terminal 300. The key operation section 234 is connected to the CPU bus 225 via the interface circuit (I/F) 233. Key input information input from the key operation section 234 is transmitted to the CPU 221, for example. The external input/output terminal 236 is connected to the CPU bus 225 via the interface circuit (I/F) 235. Thus, the terminal 236 functions as a terminal which inputs various information items from the exterior to the portable telephone terminal 300 or outputs information from the portable telephone terminal 300 to the exterior.

In this application example, the ROM 222, RAM 223 and flash memory 224 are used, but it is possible to replace the flash memory 224 by a magnetic random access memory and further replace the ROM 222 by a magnetic random access memory.

Application Example 3

FIGS. 13 to 17 show examples in which a magnetic random access memory is applied to cards (MRAM cards) which receive media contents such as smart media or the like.

An MRAM chip 401 is contained in an MRAM card body 400. An opening portion 402 corresponding in position to the MRAM chip 401 is formed in the card body 400 so as to expose the MRAM chip 401. A shutter 403 is provided on the opening portion 402 so that the MRAM chip 401 can be protected by the shutter 403 when the MRAM card is carried. The shutter 403 is formed of a material such as ceramic which has an effect of shielding external magnetic fields. When data is transferred, the shutter 403 is released to expose the MRAM chip 401. An external terminal 404 is used to output contents data stored in the MRAM card to the exterior.

Figure 14:
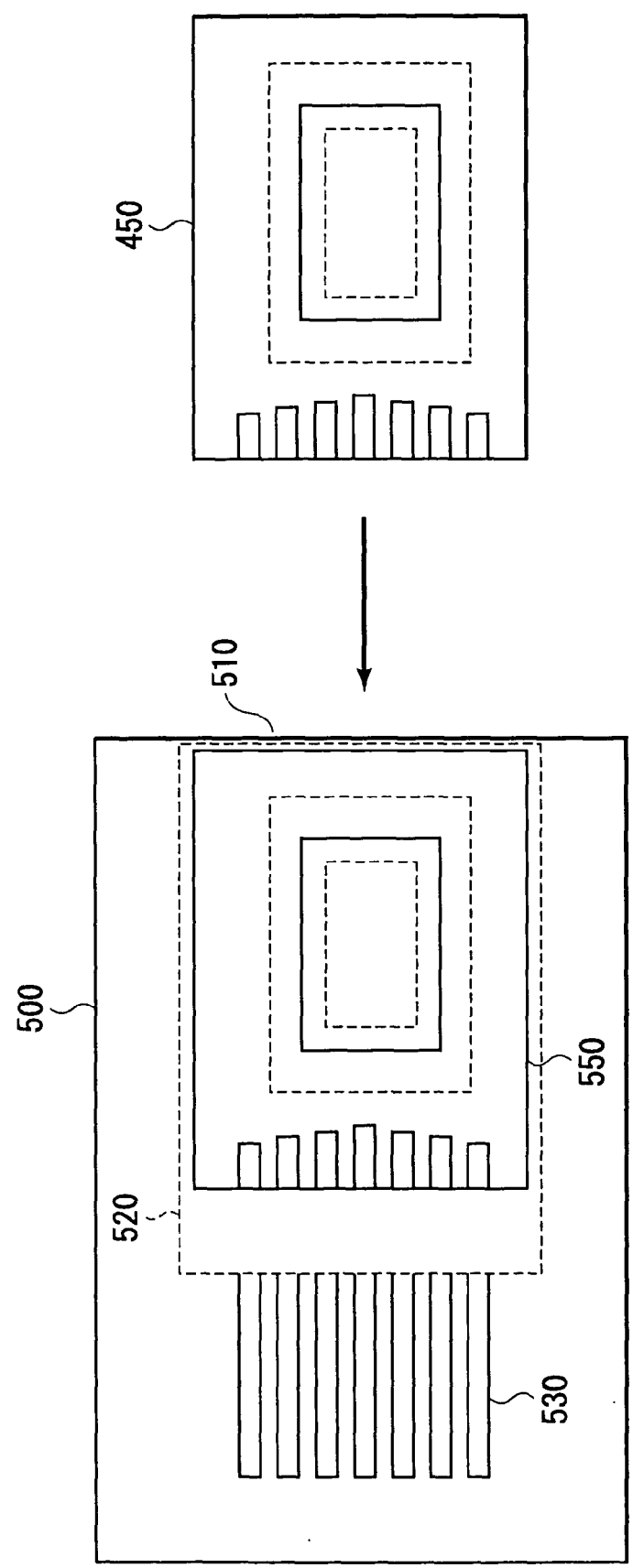
FIG. 14 is a schematic plan view showing a transfer device used to transfer data to an MRAM card.
Figure 15:
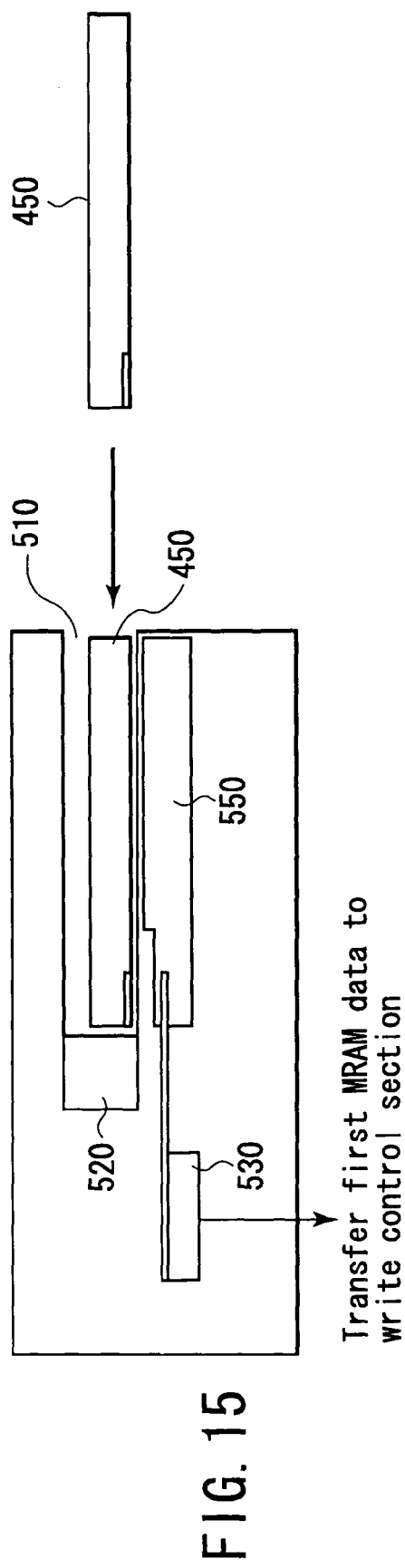
FIG. 15 is a cross-sectional view showing a transfer device used to transfer data to an MRAM card.

FIGS. 14 and 15 show a transfer device which transfers data to the MRAM card. FIG. 14 is a top plan view of a card insertion type transfer device and FIG. 25 is a cross-sectional view showing the transfer device. A second MRAM card 450 which an end user uses is inserted via an inserting portion 510 of a transfer device 500 as indicated by an arrow and pushed into the transfer device until it is stopped by a stopper 520. The stopper 520 also functions as a member which aligns the second MRAM card 450 with a first MRAM 550. When the second MRAM card 450 is placed in a preset position, a control signal is supplied from a first MRAM data rewriting control section to an external terminal 530. As a result, data stored in the first MRAM 550 is transferred to the second MRAM card 450.

Figure 16:
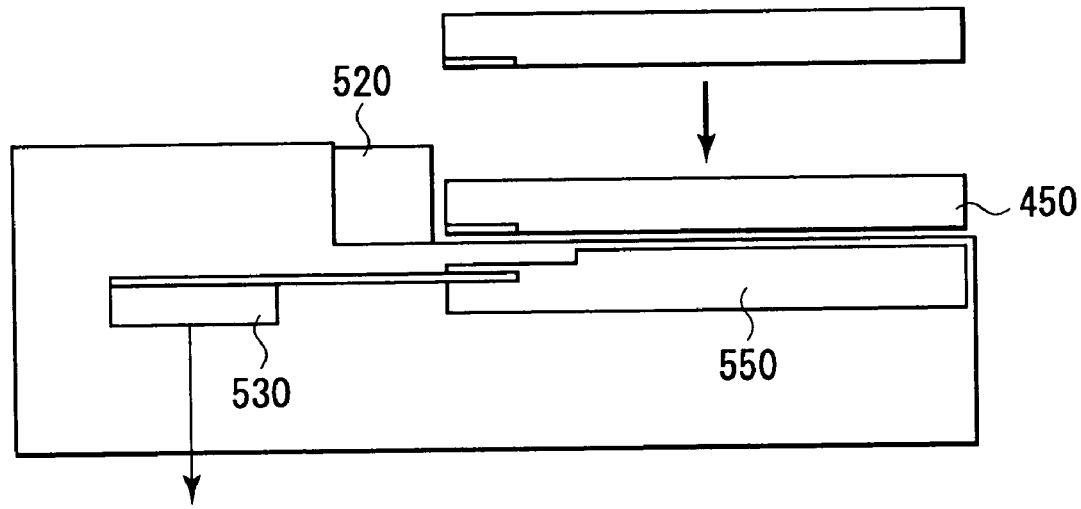
FIG. 16 is a cross-sectional view showing a fitting type transfer device used to transfer data to an MRAM card.

FIG. 16 shows a fitting type transfer device. The transfer device is of a type in which the second MRAM card 450 is fitted into and mounted on the first MRAM 550 as indicated by an arrow with the stopper 520 used as a target. The data transfer method is the same as that of the card insertion type and the explanation thereof is omitted.

Figure 17:
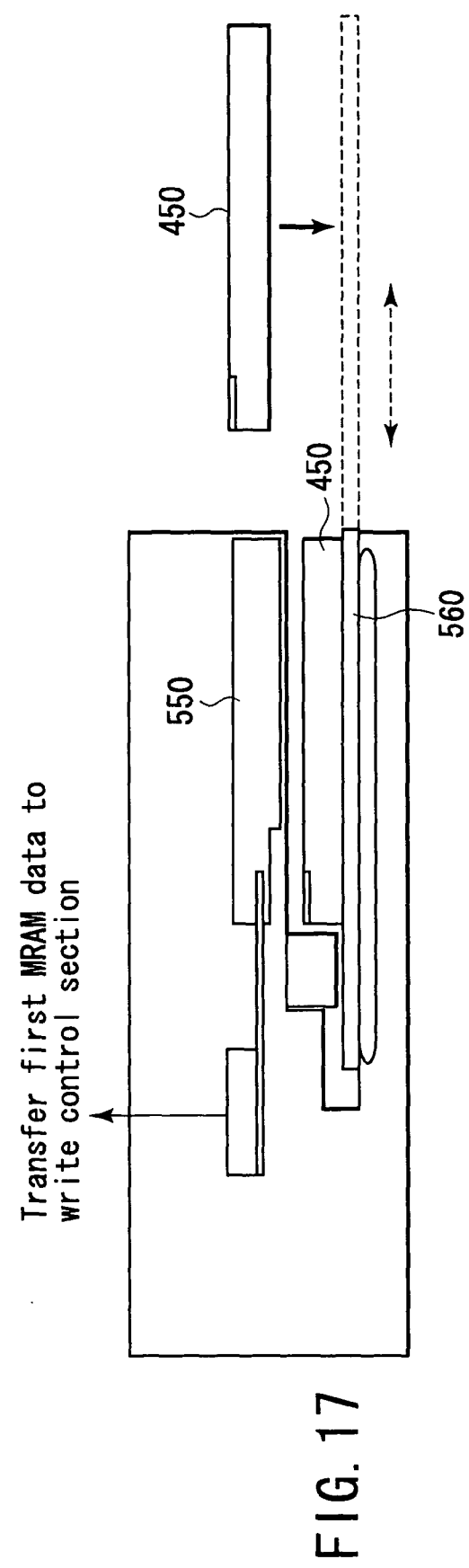
FIG. 17 is a cross-sectional view showing a slide type transfer device used to transfer data to an MRAM card.
Figure 20:
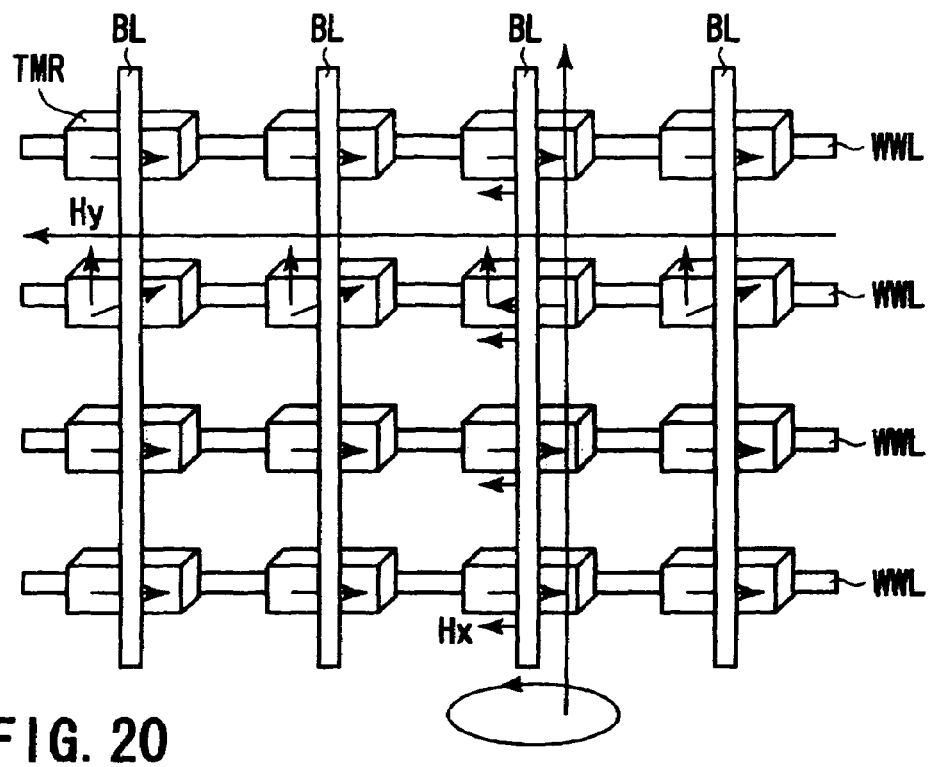
FIG. 20 is a diagram showing a principle underlying the operation of writing data.
Figure 21A:
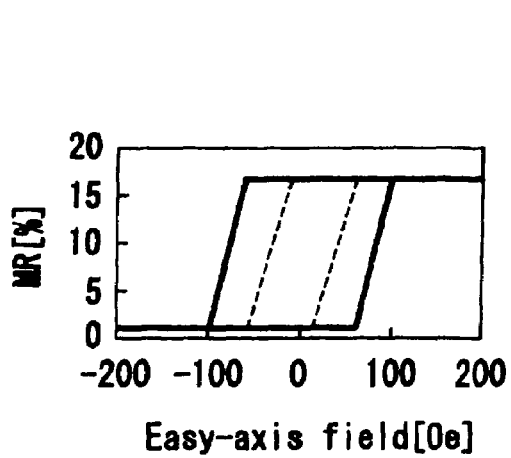
FIG. 21A is a diagram showing a TMR curve.
Figure 21B:
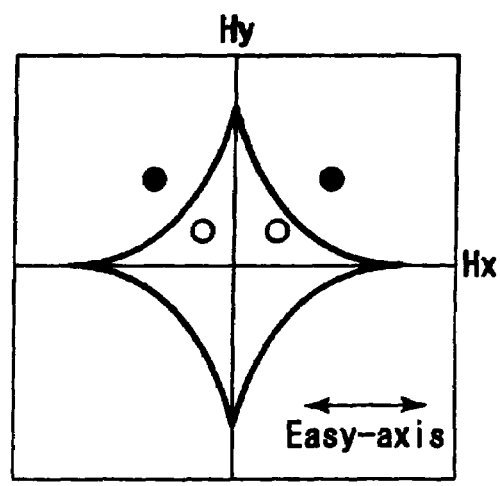
FIG. 21B is a diagram showing an asteroidal curve.
Figure 22:
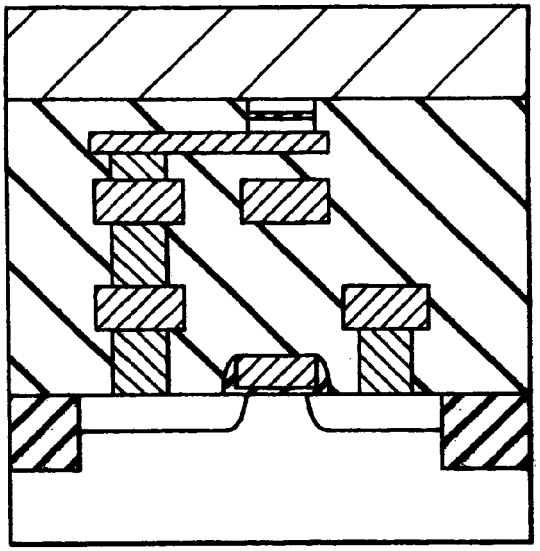
FIG. 22 is a cross sectional view showing a typical magnetic random access memory.
Figure 24:
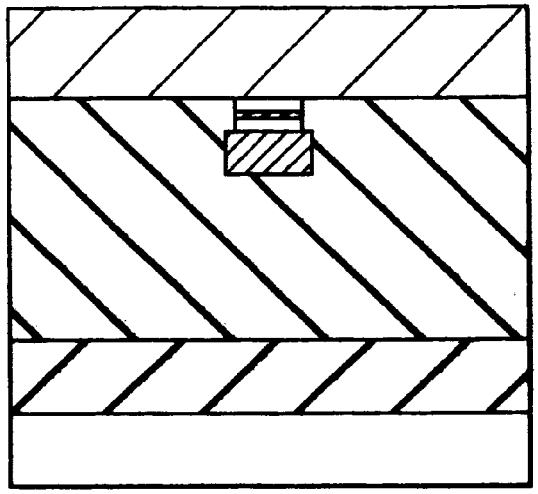
FIG. 24 is a cross sectional view showing still another typical magnetic random access memory.
Figure 23:
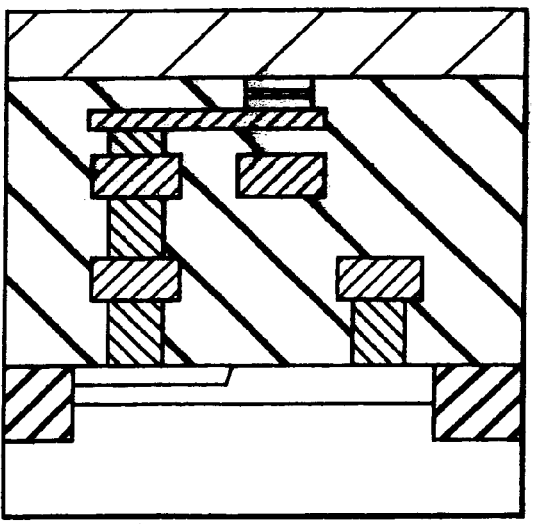
FIG. 23 is a cross sectional view showing another typical magnetic random access memory.

FIG. 17 shows a slide type transfer device. Like a CD-ROM driver or DVD driver, a transfer device 500 has a reception plate slide 560 and the reception plate slide 560 is moved in a direction as indicated by an arrow. When the reception plate slide 560 is moved to a position indicated by broken lines, the second MRAM card 450 is placed on the reception plate slide 560 and then inserted into the transfer device 500. The fact that the second MRAM 450 is inserted and the front end portion thereof abuts against the stopper 520 and the data transfer method are the same as those of the card insertion type and the explanation thereof is omitted.

While the present invention is described above by way of the first through third embodiments, the present invention is by no means limited to these embodiments, which may be modified or altered in various different ways without departing from the scope of the invention.

Additionally, while the first through third embodiments may be realized independently, any two of them or all the three may be combined appropriately for use.

Still additionally, each of the first through third embodiments includes various different phases of the invention. Therefore, any of such different phases of the invention may be extracted by appropriately combining a plurality of components of the invention as disclosed above by way of the embodiments.

Furthermore, while the above described first through third embodiments are magnetic random access memories, a semiconductor integrated circuit device containing any of such magnetic random access memories, for instance a processor or a system LSI, is also found within the scope of the present invention.

Thus, as described above by way of the first through third embodiments, according to the invention, there is provided a semiconductor integrated circuit device comprising memory cells including magneto-resistive elements and adapted to reduce the cell area of the memory cells if compared with that of memory cells including magneto-resistive elements and switching elements and suppress degradation of the voltage resisting performance of the magneto-resistive element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   magneto-resistive elements;
   bit lines electrically connected to the magneto-resistive elements at an end of the magneto-resistive element;
   read word lines electrically connected to the magneto-resistive elements at the other end of the magneto-resistive element; and
   write word lines insulated from the magneto-resistive elements and adapted to apply a magnetic field to selected magneto-resistive elements at the time of writing data to the selected magneto-resistive elements.

2. The device according to claim 1, wherein the write word lines are arranged in parallel with the read word lines and the magneto-resistive elements are arranged above the write word lines.

3. The device according to claim 2, wherein the read word lines are electrically connected to the magneto-resistive elements at the other end thereof by way of wires arranged at a level between the magneto-resistive elements and the write word lines.

4. The device according to claim 2, wherein the write word lines and the read word lines are arranged at the same level.

5. A semiconductor integrated circuit device comprising:
   first magneto-resistive elements;
   second magneto-resistive elements;
   first bit lines electrically connected to the first magneto-resistive elements at an end of the magneto-resistive element;

second bit lines electrically connected to the second magneto-resistive elements at an end of the magneto-resistive element;

first word lines electrically connected to the first magneto-resistive elements at the other ends of the magneto-resistive element and insulated from the second magneto-resistive elements; and second word lines electrically connected to the second magneto-resistive elements at the other ends of the magneto-resistive element and insulated from the first magneto-resistive elements; wherein the first word lines are arranged in parallel with the second word lines, the first magneto-resistive elements are arranged above the second word lines and the second magneto-resistive elements are arranged above the first word lines.

6. The device according to claim 5, wherein the first word lines are electrically connected to the first magneto-resistive elements at the other end thereof by way of first wires arranged at a level between the first magneto-resistive elements and the first word lines, and the second word lines are electrically connected to the second magneto-resistive elements at the other end thereof by way of second wires arranged at a level between the second magneto-resistive elements and the first word lines.

7. The device according to claim 6, wherein the first word lines and the second word lines are arranged at the same level and the first wires and the second wires are arranged at the same level.

8. The device according to claim 5, wherein the first word lines operate as read word lines when reading data from the first magneto-resistive elements and as write word lines when writing data to the second magneto-resistive elements, whereas the second word lines operate as read word lines when reading data from the second magneto-resistive elements and as write word lines when writing data to the first magneto-resistive elements.

9. The device according to claim 6, wherein the first word lines operate as read word lines when reading data from the first magneto-resistive elements and as write word lines when writing data to the second magneto-resistive elements, whereas the second word lines operate as read word lines when reading data from the second magneto-resistive elements and as write word lines when writing data to the first magneto-resistive elements.

10. The device according to claim 7, wherein the first word lines operate as read word lines when reading data from the first magneto-resistive elements and as write word lines when writing data to the second magneto-resistive elements, whereas the second word lines operate as read word lines when reading data from the second magneto-resistive elements and as write word lines when writing data to the first magneto-resistive elements.

11. The device according to claim 5, wherein the first word lines are arranged in parallel with the second word lines and the device further comprises third word lines arranged in parallel with the first and second word lines, the first magneto-resistive elements being arranged above the second word lines, the second magneto-resistive elements being arranged above the third word lines.

12. The device according to claim 11, wherein the first word lines are electrically connected to the first magneto-resistive elements at the other end thereof by way of first wires arranged at a level between the first magneto-resistive elements and the first word lines and the second word lines are electrically connected to the second magneto-resistive elements at the other end thereof by way of second wires arranged at a level between the second magneto-resistive elements and the third word lines.

13. The device according to claim 12, wherein the first, second and third word lines are arranged at the same level and the first and second wires are arranged at the same level.

14. The device according to claim 11, wherein the first word lines operate as read word lines when reading data from the first magneto-resistive elements and the second word lines operate as read word lines when reading data from the second magneto-resistive elements and as write word lines when writing data to the first magneto-resistive elements, while the third word lines operate as write word lines when writing data to the second magneto-resistive elements.

15. The device according to claim 12, wherein the first word lines operate as read word lines when reading data from the first magneto-resistive elements and the second word lines operate as read word lines when reading data from the second magneto-resistive elements and as write word lines when writing data to the first magneto-resistive elements, while the third word lines operate as write word lines when writing data to the second magneto-resistive elements.

16. The device according to claim 13, wherein the first word lines operate as read word lines when reading data from the first magneto-resistive elements and the second word lines operate as read word lines when reading data from the second magneto-resistive elements and as write word lines when writing data to the first magneto-resistive elements, while the third word lines operate as write word lines when writing data to the second magneto-resistive elements.

* * * * *